United States Patent

Duncan et al.

[11] Patent Number: 5,875,897
[45] Date of Patent: Mar. 2, 1999

[54] PACKAGING APPARATUS AND METHOD

[75] Inventors: William V Duncan, Scottsdale; Richard J. Barton, Tempe, both of Ariz.

[73] Assignee: Motorola, Inc., Schaumburg, Ill.

[21] Appl. No.: 838,479

[22] Filed: Mar. 31, 1997

[51] Int. Cl.$^6$ ................................................ B65D 73/02
[52] U.S. Cl. ............................ 206/714; 206/522; 383/3; 242/905
[58] Field of Search ..................... 206/400, 413, 206/714, 717, 719, 720, 725, 522, 397, 389; 383/3; 53/453; 242/905, 613, 610, 604, 601

[56] References Cited

U.S. PATENT DOCUMENTS

| | | | |
|---|---|---|---|
| 4,635,789 | 1/1987 | Webb | 206/53 |
| 4,872,558 | 10/1989 | Pharo . | |
| 4,874,093 | 10/1989 | Pharo . | |
| 4,918,904 | 4/1990 | Pharo . | |
| 4,949,530 | 8/1990 | Pharo . | |
| 5,136,827 | 8/1992 | Sawaya | 206/330 |
| 5,238,105 | 8/1993 | Smiley | 206/223 |
| 5,263,587 | 11/1993 | Elkin et al. | 206/522 |
| 5,272,856 | 12/1993 | Pharo . | |
| 5,293,996 | 3/1994 | Duncan . | |
| 5,390,472 | 2/1995 | Weiler et al. | 53/412 |
| 5,494,168 | 2/1996 | Hart | 206/714 |
| 5,551,646 | 9/1996 | Goldstein | 242/419 |

Primary Examiner—Paul T. Sewell
Assistant Examiner—Nhan T. Lam
Attorney, Agent, or Firm—Robert D. Atkins; Robert F. Hightower

[57] ABSTRACT

A packaging system (100) protects integrated circuit devices (106) from corrosion and mechanical damage. The devices are enclosed in a reel (102) having a hub (114) in which a cavity (116) is formed for retaining a molded desiccant (118). Apertures (120) between the cavity and the devices provide a vapor path for drawing moisture from the devices. A banding strip (108) for enclosing the devices within the reel has recessed areas (142) for housing pellets of desiccant (140). The reel is placed in an inflatable envelope (50) that includes view ports (56) for reading identifying information on the reel. A vacuum is drawn and the envelope is sealed. Air cells (52) in the inflatable envelope are inflated to cushion the devices from mechanical damage during shipment.

32 Claims, 4 Drawing Sheets

PACKAGING APPARATUS AND METHOD

BACKGROUND OF THE INVENTION

The present invention relates in general to semiconductor devices and, more particularly, to semiconductor device packaging systems.

The complexity of modern integrated circuits and other environmentally sensitive devices has increased their susceptibility to damage from environmental factors. As a result, most devices are transported from the factory to a customer in packages that minimize handling damage and damage from electrostatic discharge (ESD) and humidity. In a typical packaging system, devices are mounted on a carrier tape which is wound on a reel and held in place with a strip of masking tape attached to the leader of the carrier tape. The reel assembly is shipped in a conductive aluminized bag to prevent high electrostatic potentials from building up across pins of the integrated circuits and damaging internal components. Humidity is controlled by drawing a vacuum in the aluminized bag and sealing the bag to prevent moisture from entering.

Residual moisture within the aluminized bag is controlled by a granular or powdered desiccant such as silica gel, which is placed in a nylon bag and inserted in the aluminized bag with the reel assembly prior to vacuum sealing. The desiccant bags are placed in strategic locations within the aluminized bag to limit damage. Placement is often performed manually, which is time consuming and expensive. For example, in some packaging systems, the desiccant bag is placed over the reel assembly and held in place by the vacuum seal. A problem with such systems is that the desiccant bag creates a bulge in the aluminized bag which creates uneven pressure on the reel assembly. During shipment, the uneven pressure can deform the reel and damage the integrated circuit leads.

In other packaging systems, desiccant bags are placed in corners of the aluminized package, which allows the reels to be stacked without becoming deformed. However, when a vacuum is created and the sides of the aluminized bag collapse, the desiccant bags can become sealed off from the reel assembly, effectively creating a vapor barrier that prevents moisture from being drawn away from the devices.

Aluminized bags are opaque, so that identifying the devices within the bag requires opening the bag and releasing the vacuum. Providing view windows in the aluminized bags increases cost and increases the potential for leakage at the seam of the view window.

Hence, there is a need for a packaging system for semiconductor devices which more reliably provides both ESD and humidity protection while protecting the leads of the semiconductor device from being deformed or damaged.

DETAILED DESCRIPTION OF THE DRAWINGS

Figure 1:
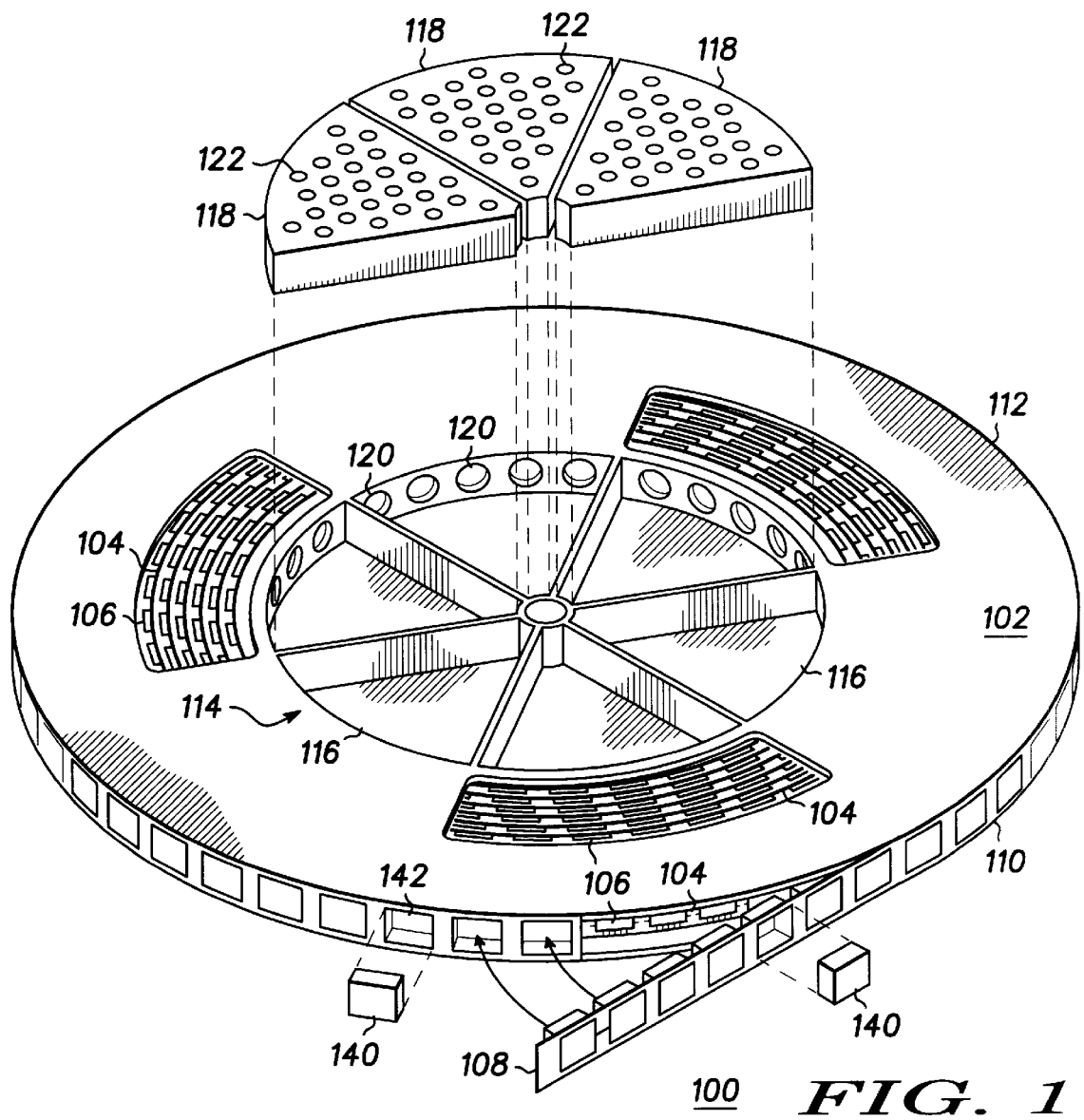
FIG. 1 is an exploded isometric view of a device transport apparatus.

FIG. 1 is an exploded isometric view of a device transport apparatus 100 for packaging integrated circuits or other environmentally sensitive components for shipping. Device transport apparatus 100 includes a reel 102 on which is wound a carrier tape 104 housing a plurality of semiconductor devices 106 such as integrated circuits. Depending on the type of integrated circuit package, carrier tape 104 either has molded cavities for housing the integrated circuits or is fabricated as a flat tape with adhesive regions for attaching integrated circuit devices 106. Carrier tape 104 is made of polystyrene or polycarbonate impregnated with carbon black or similar conductive material to protect devices 106 from damage caused by electrostatic discharge (ESD). Carrier tape 104 is enclosed on reel 102 by a self-locking banding strip 108. Alternatively, banding strip 108 includes an end clip (not shown) for holding in place around the circumference of reel 102.

Reel 102 is made from a plastic such as polystyrene impregnated with carbon black to provide ESD protection to devices 106. Further ESD protection is provided by applying a topical anti-static coating to reel 102. Reel 102 includes a hub 114 which connects sides 110 and 112 to define a storage region within reel 102 for winding carrier tape 104. Cavities 116 are created in hub 114 to retain molded wedges 118 of a device protective material such as a desiccant. Wedges 118 can also be made with a static intercept material that emits copper ions to protect integrated circuit leads from corrosion. In order for wedges 118 to provide a protective function for devices 106, a number of apertures 120 are formed in hub 114 to provide a vapor path between the storage region and cavities 116. For example, where wedges 118 comprise a molded desiccant, apertures 120 are drilled, bored, molded, etc., to provide a moisture path from devices 106 to wedges 118, which allows the desiccant to draw moisture from devices 106.

To form wedges 118, the device protective material is mixed with a nylon base and molded for press-fitting into cavities 116. When the device protective material comprises a desiccant, the desiccant is preferably silica gel or a molecular sieve or similar substance which is non-corrosive to devices 106. Nylon is a useful base because of its ease of shaping and its porosity, which allows vapor to pass through to the desiccant material with minimal obstruction. Moisture absorption is further improved by forming openings 122 in wedges 118 to increase the effective surface area of the desiccant. The molded desiccant can be reused by heating wedges 118 in a drying oven to remove moisture.

The sides of cavities 116 taper inwardly toward the opening of cavities 116 such that the sides expand to receive wedges 118. Once inserted, wedges 118 are retained in cavities 116 by the pressure exerted by the inward taper of the sides. As an alternative to press-fitting, wedges 118 can be held in place in cavities 116 with a tab or similar retaining device (not shown) molded into hub 114.

Banding strip 108 is a flexible plastic strip which circumscribes the outer perimeter of reel 102 to enclose the storage region. Banding strip 108 is formed from polystyrene impregnated with carbon black to provide additional ESD protection. Additional moisture protection is provided with molded pellets of a device protective material that are lodged in recesses molded into banding strip 108.

Device transport apparatus 100 thereby comprises an integrated assembly for storing and protecting devices 106 that includes reel 102, carrier tape 104, banding strip 108 and the molded device protective material. An advantage of providing a protective function by integrating wedges 118 in cavities 116 such that wedges 118 and reel 102 are handled as a single assembly is that such an integral unit is easier to handle and less costly than prior art systems. Wedges 118 are retained in predefined locations within a shipping bag such that desiccant does not contribute to deforming the leads of devices 106. Moreover, the structure of cavities 116 ensures that wedges 118 are not sealed off from devices 106 when the sides of the bag are collapsed under vacuum. An integral assembly reduces or eliminates the need for expensive manual placement of desiccant at strategic locations within the vacuum bag. Hence, reliability is improved and cost is reduced.

In the figures, elements having the same reference number provide similar functions.

Figure 2:
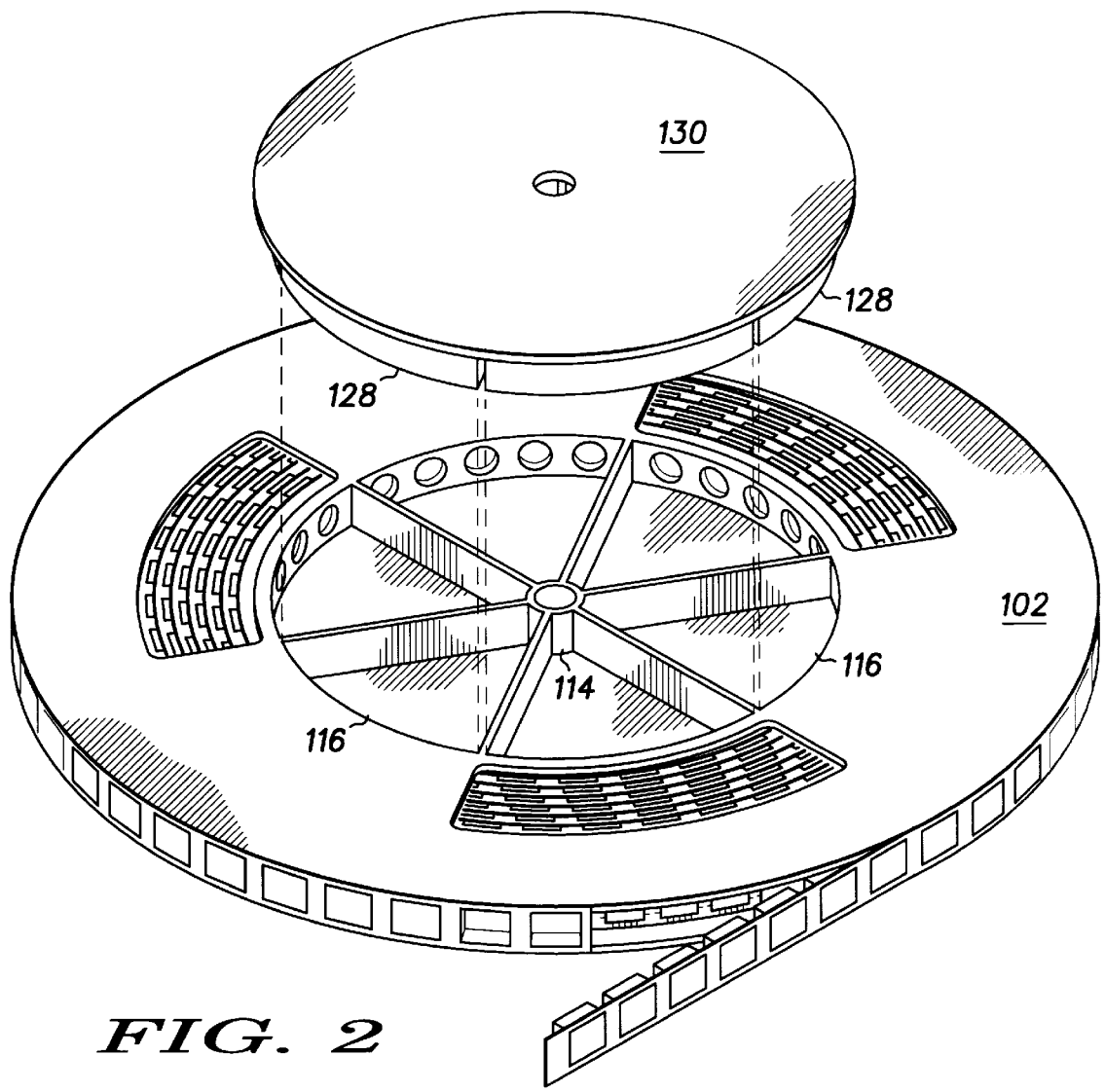
FIG. 2 illustrates a detail of an alternate embodiment of a device transport apparatus.

FIG. 2 is a detail of an alternate embodiment of a device transport apparatus, including a reel 102 and a lid 130. Reel 102 functions as described above. Lid 130 comprises a nylon and desiccant mixture as described above, which is integrated with wedges 128 for insertion into cavities 116. Wedges 128 are formed of a shape such that lid 130 can be press-fitted and retained in cavities 116. Alternatively, lid 130 attaches to hub 114 by means of a retaining clip or similar mechanism (not shown). It can be seen that lid 130 has a relatively large surface area, which improves protection of devices 106. Lid 130 typically is used as an alternative to individual wedges 118.

Figure 3:
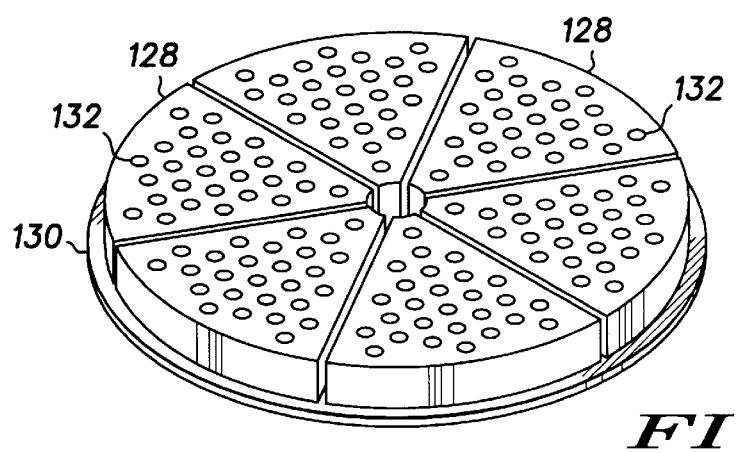
FIG. 3 is a bottom view of a lid of a device transport apparatus.

FIG. 3 is a bottom view of lid 130 shown from an isometric perspective. Wedges 128 and lid 130 are molded as an integral unit from a device protective material, as shown in the figure. Openings 132 are formed in wedges 128 and/or lid 130 to increase surface area of the protective material to provide a more effective protective function.

Figure 4:
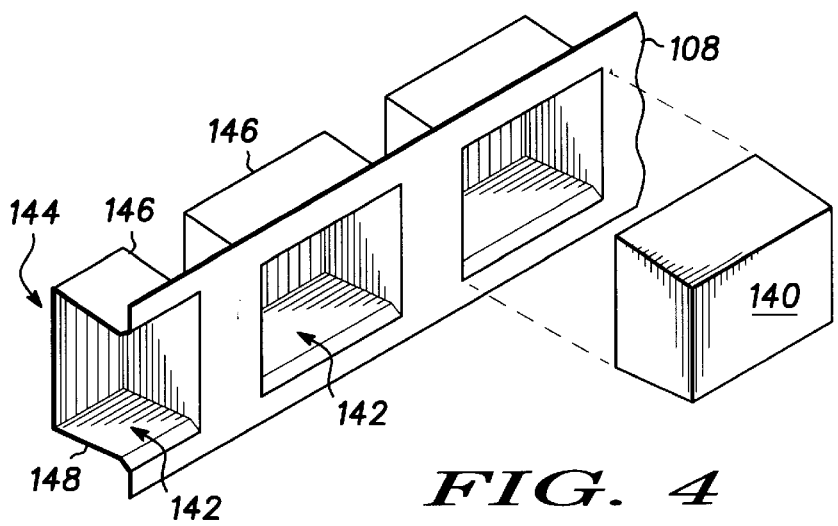
FIG. 4 illustrates a detail of a banding strip.

FIG. 4 is a detailed view of banding strip 108, including recesses 142 which are molded into banding strip 108 for housing molded pellets 140 of a desiccant material. Banding strip 108 is fabricated from polystyrene impregnated with carbon black for ESD protection. The number of recesses 142 into which pellets 140 are inserted can be varied to set the level of protection desired for devices 106. For example, when maximum protection is desired, pellets 140 are placed in each recess 142 of banding strip 108. When a lesser degree of protection is sufficient, such as when devices 106 are inherently resistant to moisture damage, pellets 140 can be inserted in only a portion of recesses 142.

A cross-section 144 taken through a recess 142 shows an inward taper of edge 148 at the opening of recess 142. Banding strip 108 is flexible, so that the opening of recess 142 expands to receive pellet 140. Once inserted, pellet 140 is retained in recess 142 by the pressure exerted by the inward taper of edge 148. Alternatively, pellets 140 are held in place in recesses 142 with a tab or similar retaining device (not shown) molded into banding strip 108 at each recess 142.

By lodging pellets 140 in recesses 142 formed in banding strip 108, pellets 140 and banding strip 108 function as an integrated unit that is easier to handle and less costly than prior art systems. An advantage of providing the protective function by integrating pellets 140 in recesses 142 such that pellets 140 and recesses 142 are handled as a single assembly is that such an integral unit is easier to handle and less costly than A prior art systems. Pellets 140 are retained in predefined locations within a shipping bag such that desiccant does not contribute to deforming the leads of devices 106. Moreover, the structure of recesses 142 ensures that pellets 140 are not sealed off from devices 106 when the sides of the bag are collapsed under vacuum. Such an integral assembly reduces or eliminates the need for expensive manual placement of desiccant at strategic locations within the vacuum bag. Hence, reliability is improved and cost is reduced.

It is seen in FIG. 4 that each recess 142 on the inside surface of banding strip 108 forms a protrusion 146 on the outside surface. The inward taper of cross-section 144 can be tailored such that a protrusion 146 can be inserted into a recess 142 from another part of banding strip 108 to function as a self-locking mechanism that retains banding strip 108 in position around the perimeter of reel 102. Such a structure reduces the cost of banding strip 108 by eliminating the need for an additional locking mechanism.

Figure 5:
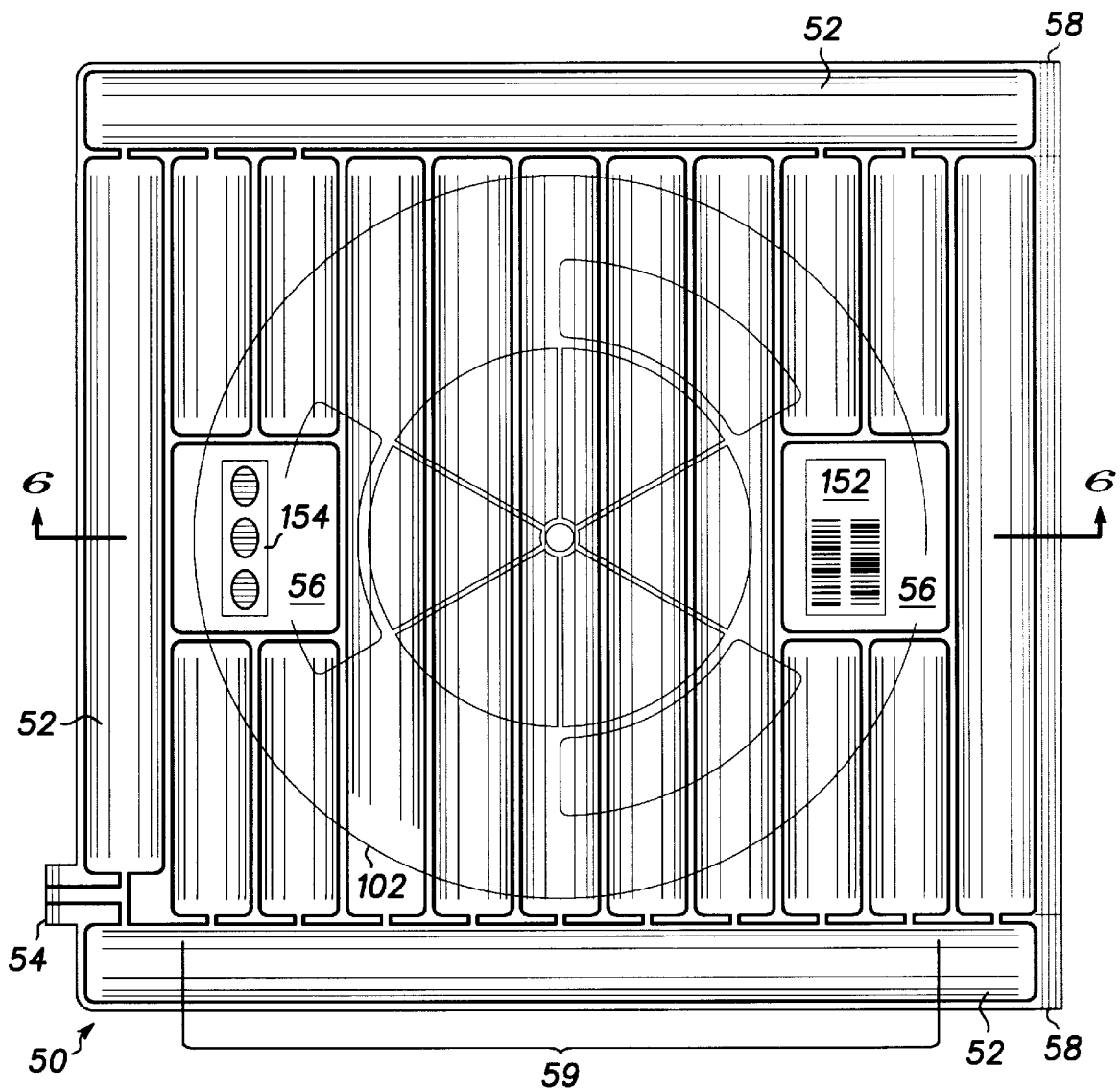
FIG. 5 is a top view of a packaging system.
Figure 6:
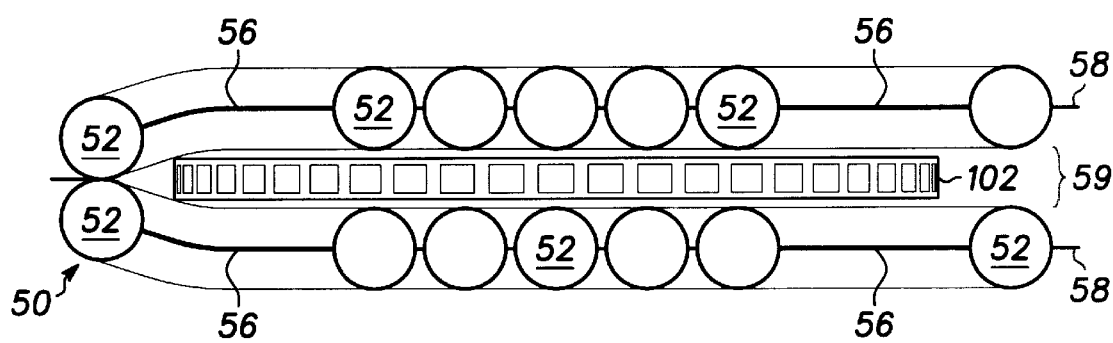
FIG. 6 is a cross-sectional side view of an open packaging system.
Figure 7:
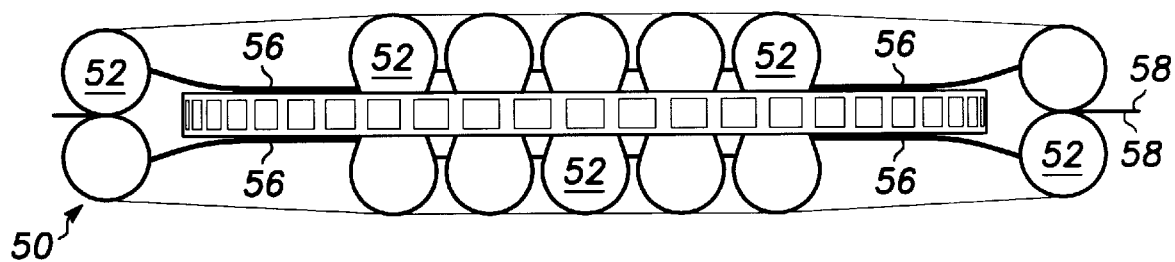
FIG. 7 is a cross-sectional side view of a closed packaging system with vacuum drawn.

FIGS. 5 and 6 are a top view and a cross-sectional side view, respectively, of an open packaging system 500 including an inflatable envelope 50 into which is inserted reel 102 housing a plurality of integrated circuit devices 106. FIG. 7 shows a similar cross-sectional side view of packaging system 500 shown in FIG. 6 except that a vacuum is drawn in inflatable envelope 50 as described below. A label 152 is attached to reel 102 to provide identifying information such as the integrated circuit device type, manufacturing lot number, etc. Label 152 can also include information used to track packaging system 500 during shipment. Information on label 152 is typically provided in a format of a bar code, an ID matrix code or similar pattern that is electrically scannable with a standard infrared scanning beam. A humidity indicator 154 is attached to reel 102 or otherwise enclosed in inflatable envelope 50 for monitoring moisture content during shipping.

Reel 102 is inserted in a storage pocket 59 of inflatable envelope 50 that is heat sealed to house integrated circuit devices 106 in a vacuum environment, thereby minimizing contamination within storage pocket 59. Storage pocket 59 is cushioned on either side by a plurality of air cells 52 as shown. Prior to shipping, air cells are inflated through a valve 54 with air, nitrogen, or another gas. Inflatable envelope 50 comprises a nylon/polyolefin mixture which is coated with a topical antistatic solution to prevent ESD damage. The polyolefin provides air and vacuum retention while nylon adds durability to inflatable envelope 50.

It is important that label 152 be readable in order to ensure that the enclosed integrated circuit devices are not misidentified. Prior art packaging systems often house devices in vacuum-sealed aluminized bags. Such bags are opaque, so that once the devices are sealed within the bags the devices cannot be identified without opening the bags and releasing the vacuum. Aluminized bags can be formed with transparent view windows, but the windows are made from a different material than that of the aluminized bags. Bonding the window material to the aluminized bag material increases the cost and creates a source for vacuum leaks at the seam formed between the view window and the aluminized package.

The nylon/polyolefin material used to fabricate inflatable envelope 50 is transparent, so that interior regions of inflatable envelope 50 are typically human readable. However, label 152 cannot accurately scan encoded information such as bar codes when air cells 52 are inflated, due to the focal distance between the infrared scanning beam and label 152. To reduce the focal distance, view ports 56 are created in inflatable envelope 50 by using a heat sealing or equivalent process to bond opposing surfaces of air cells 52. Therefore, there is no seam to be sealed to prevent storage pocket 59 from leaking. Because the nylon/polyolefin material is transparent to infrared light, labels 152 can be scanned through view ports 56. The additional cost of providing such view ports 56 is minimal because view ports 56 are formed with a simple heat sealing process from a material that is continuous with inflatable envelope 50. When storage pocket 59 is drawn to a vacuum, view port 56 is caused to conform to reel 102, which reduces the focal distance to virtually zero to facilitate viewing and electronic scanning, as shown in FIG. 7.

For shipping, reel 102 is inserted into inflatable envelope 50 when air cells 52 are deflated. Inflatable envelope is placed in a vacuum chamber to draw a vacuum in storage pocket 59. Flaps 58 are heat sealed to maintain the vacuum. Prior to shipping, air cells 52 are inflated through valve 54 to provide cushioning for reel 102 and its enclosed integrated circuit devices. When inflated, air cells 52 expand to restrict movement of reel 102 within storage pocket 59.

To remove reel 102, air cells 52 are deflated and inflatable envelope 50 is opened by cutting off the heat sealed portion of flaps 58. Cut lines (not shown) on flaps 58 can be used to indicate where flaps 58 should be cut. To promote reuse and reduce the cost of inflatable envelope 50, flaps 58 are fabricated to a length sufficient to make several cuts in flaps 58 while allowing remaining portions to be resealed. After removing reel 102, inflatable envelope 50 is returned to the integrated circuit vendor, who inserts another reel and begins a new shipping cycle. Inflatable envelope 50 can be reused until flaps 58 are too short to allow storage pocket 59 to be sealed. In one embodiment, flaps 58 are made with sufficient length for using inflatable envelope 50 at least four times.

Integrated circuit devices are manufactured through a series of steps that result in the fabrication of physical structures on a semiconductor substrate. Many such steps are designed to protect the devices from adverse environmental influences such as contamination, corrosion and ESD, which often result in premature failure or reduced reliability of the devices. Throughout the manufacturing process, wafers and devices are housed in highly controlled environments, such as dust proof containers, that prevent undesirable impurities from entering the semiconductor material.

The preparation of integrated circuit devices for shipment is part of the process of manufacturing semiconductor devices, including attaching the devices to a carrier tape, winding the carrier tape on a reel, enclosing the carrier tape with a banding strip, housing the protective material in a cavity of the reel or a recess of the banding strip, placing the reel assembly in an inflatable bag, etc. Such preparation is important for maintaining the quality of devices received by an end user and is performed when shipping devices from one manufacturing location to another or from the manufacturer to an end user. As an example, integrated circuits that are encapsulated in one location and shipped to another location for testing are housed in protective packages to prevent environmental damage. Similarly, devices are housed in protective packages before shipping to an end user. As described above, the packaging system of the present invention reduces handling damage and prevents moisture and other detrimental materials from entering the devices. Consequently, the end user receives devices of higher quality and reliability.

By now it should be appreciated that an advantage of the present invention is achieved by integrating a device protective material with an element of the packaging system. Integrating includes housing a molded desiccant in a cavity of the reel or in a recessed area of the banding strip. Hence, the present invention provides an integrated assembly for packaging integrated circuit devices in an environment that prevents mechanical and corrosion damage. The devices are housed on a carrier tape that is wound in a storage region of a reel enclosed with a banding strip. Residual moisture is drawn from the devices by a desiccant that is molded for housing in cavities formed in a hub of the reel. Apertures are formed in the hub between the cavities and the storage region to provide a vapor path from the devices to the desiccant. The desiccant is retained in the cavities to prevent movement within a storage pocket that could result in the desiccant either deforming or becoming isolated from the devices when a vacuum is created in the storage pocket. Additional moisture protection is provided by a banding strip which encloses the devices within the reel and houses pellets of desiccant. The devices are thereby enclosed in a storage region of the reel which is surrounded by desiccant to prevent moisture from entering.

The reel is inserted in the storage pocket of an inflatable envelope. A vacuum is created and sealed within the storage pocket. The storage pocket is cushioned by air cells integrated in the inflatable envelope. The air cells are inflated after the storage pocket is evacuated, thereby expanding the air cells to restrict movement of the reel assembly within the storage pocket. The cushioning and motion restricting effects of the air cells buffer the devices from mechanical damage during shipment. Identification information enclosed in the storage pocket is viewed or electrically scanned through view ports formed in the inflatable envelope by bonding together opposing surfaces of the air cells.

What is claimed is:

1. A device housed in a packaging system, the packaging system comprising:

a device transport apparatus having a first side and a second side connected by a hub to define a storage region for housing the device, wherein a cavity is formed in the hub and an aperture is formed in the hub between the cavity and the storage region; and a device protective material disposed in the cavity.

2. The device of claim 1, wherein the device is formed from a semiconductor material.

3. The device of claim 1, wherein the the cavity is for retaining a first molded desiccant for drawing vapor from the storage region through the aperture.

4. The device of claim 3, wherein the first molded desiccant includes silica gel.

5. The device of claim 1, further comprising a carrier tape for housing the device and for winding on the hub within the storage region.

6. The device of claim 1, further comprising an inflatable envelope having a storage pocket for disposing the device transport apparatus in a vacuum and an air cell that cushions the device transport apparatus when the air cell is inflated.

7. The device of claim 6, wherein a view port is formed in the inflatable envelope for viewing regions internal to the inflatable envelope.

8. A device housed in a packaging system, the packaging system comprising:

a device transport apparatus having a first side and a second side connected by a hub to define a storage region for housing the device, wherein a cavity is formed in the hub and an aperture is formed in the hub between the cavity and the storage region;

a carrier tape for housing the device and for winding on the hub within the storage region;

a device protective material disposed in the cavity; and a banding strip for enclosing the carrier tape within the storage region, where the banding strip houses a second molded desiccant.

9. The device of claim 8, wherein the second molded desiccant is lodged in a recessed area of the banding strip.

10. A device housed in a packaging system, wherein the packaging system comprises:

a device transport apparatus having a storage region for housing the device;

a banding strip for enclosing the storage region, where the banding strip houses a device protective material.

11. The device of claim 10, wherein the device is formed from a semiconductor material.

12. The device of claim 10, wherein the device protective material is lodged in a recessed area of the banding strip.

13. The device of claim 12, wherein the device transport apparatus includes a reel, further comprising a carrier tape for housing the device and for winding on the reel within the storage region.

14. The device of claim 13, wherein the storage region is defined by first and second sides of the reel, and the banding strip is disposed around first and second perimeters of the first and second sides to enclose the carrier tape within the storage region.

15. The packaging system of claim 12, wherein the device protective material comprises a molded desiccant housed in the cavity for drawing vapor from the storage region through the aperture.

16. The device of claim 10, further comprising an inflatable envelope for disposing the device transport apparatus and the banding strip, wherein the inflatable envelope includes:

a storage pocket for disposing the device transport apparatus and the banding strip in a vacuum;

an air cell for inflating to cushion the device transport apparatus and the banding strip; and a view port for viewing regions internal to the inflatable envelope.

17. A packaging system for transporting a device, comprising:

a device transport apparatus having a hub that connects a first side and a second side of the device transport apparatus to define a storage region for housing the device;

a banding strip for enclosing the device within the storage region; and a device protective material housed in a cavity of the device transport apparatus.

18. The packaging system of claim 17, wherein the device comprises a semiconductor device.

19. The packaging system of claim 17, wherein the hub and the first and second sides are included in a reel of the device transport apparatus, and the cavity is formed in the hub.

20. The packaging system of claim 19, wherein an aperture is formed in the hub between the cavity and the storage region.

21. The packaging system of claim 17, further comprising a carrier tape for housing the device and for winding on the hub within the storage region.

22. The packaging system of claim 17, further comprising an inflatable envelope having a storage pocket for disposing the device transport apparatus in a vacuum and an air cell that cushions the device transport apparatus when the air cell is inflated.

23. The packaging system of claim 22, wherein a view port is formed in the inflatable envelope for viewing regions internal to the inflatable envelope.

24. A method of manufacturing a semiconductor device, comprising the step of integrating a device protective material into a reel that houses the semiconductor device.

25. The method of claim 24, wherein the step of integrating includes a step of retaining the device protective material in a cavity of the reel.

26. The method of claim 25, further comprising a step of providing a vapor path between the cavity and the semiconductor device.

27. The method of claim 26, wherein the step of providing a vapor path includes a step of drawing moisture from the semiconductor device through the vapor path.

28. The method of claim 24, wherein the step of integrating includes a step of lodging the device protective material in a banding strip of the reel.

29. The method of claim 28, wherein the step of lodging the device protective material in a banding strip includes disposing a molded desiccant in a recessed area of the banding strip.

30. A packaging system for transporting a device, comprising:

a device transport apparatus having a hub that connects a first side and a second side of the device transport apparatus to define a storage region for housing the device;

a banding strip for enclosing the device within the storage region; and a device protective material lodged in a recess of the banding strip.

31. The packaging system of claim 30, wherein the banding strip is disposed around first and second perimeters of the first and second sides of the device transport apparatus to enclose the carrier tape within the storage region.

32. The packaging system of claim 30, further comprising an inflatable envelope having a storage pocket for disposing the device transport apparatus in a vacuum and an air cell that cushions the device transport apparatus when the air cell is inflated.

* * * * *